United States Patent [19]

Pissanetzky

[11] Patent Number: 5,359,310
[45] Date of Patent: Oct. 25, 1994

[54] ULTRASHORT CYLINDRICAL SHIELDED ELECTROMAGNET FOR MAGNETIC RESONANCE IMAGING

[75] Inventor: Sergio Pissanetzky, The Woodlands, Tex.

[73] Assignee: Houston Advanced Research Center, The Woodlands, Tex.

[21] Appl. No.: 869,544

[22] Filed: Apr. 15, 1992

[51] Int. Cl.$^5$ .................. G01V 3/00; H01F 7/22; H01F 3/00
[52] U.S. Cl. .................. 335/301; 335/216; 335/299; 335/297; 324/318; 324/319
[58] Field of Search .......... 335/216, 296–301; 324/318, 319, 320

[56] References Cited

U.S. PATENT DOCUMENTS

| | | | |
|---|---|---|---|
| 4,490,675 | 12/1984 | Knuettel et al. | 324/319 |
| 4,587,490 | 5/1986 | Muller et al. | 324/320 |
| 4,590,428 | 5/1986 | Muller et al. | 324/320 |
| 4,590,452 | 5/1986 | Ries et al. | 335/301 |
| 4,595,899 | 6/1986 | Smith et al. | 335/216 |
| 4,612,505 | 9/1986 | Zijlstra | 324/318 |
| 4,646,045 | 2/1987 | Chari et al. | 335/301 |
| 4,689,591 | 8/1987 | McDougall | 335/299 |
| 4,721,914 | 1/1988 | Fukushima et al. | 324/320 |
| 4,783,628 | 11/1988 | Huson | 324/320 |
| 4,822,772 | 4/1989 | Huson | 505/1 |
| 4,912,445 | 3/1990 | Yomasaki et al. | 335/301 |
| 4,924,185 | 5/1990 | Matsutani | 324/319 |
| 4,968,915 | 11/1990 | Wilson et al. | 335/301 |
| 5,001,448 | 3/1991 | Srivastava et al. | 335/301 |
| 5,012,217 | 4/1991 | Palkovich et al. | 335/301 |

FOREIGN PATENT DOCUMENTS

| | | | |
|---|---|---|---|
| 48701 | 1/1987 | Japan | 324/319 |
| 1564 | 2/1991 | PCT Int'l Appl. | 335/299 |

OTHER PUBLICATIONS

Siebold, et al., "Performance and Results of a Computer Program for Optimizing Magnets with Iron", *IEEE Trans. Magnetics,* vol. 24, No. 1 (IEEE, Jan. 1988), pp. 419–422.

Everett, et al. "Spherical coils for uniform magnetic fields", *J. Sci. Instrum.,* vol. 43 (1966), pp. 470–474.

*Primary Examiner*—Leo P. Picard
*Assistant Examiner*—Raymond Barrera
*Attorney, Agent, or Firm*—Vinson & Elkins

[57] ABSTRACT

A superconducting magnet suitable for use in magnetic resonance imaging applications is disclosed. A plurality of driving coils are located around a cylindrical bore, for generating an axial magnetic field therein. At the ends of the magnet, within the same cryostat as the driving coils, first and second shielding coils are located, each carrying a current of opposite polarity relative to the driving coils. The location, size, and current in the coils are determined by a methodology in which the error between the desired field and the simulated field is minimized at target locations within the bore and outside of the bore. A flux return is disposed in the gap between the first and second shielding coils, so that the shielding coils inject return magnetic flux into the flux return. The flux return may be of iron, or may consist of a superconducting coil. The resulting magnet has relatively low superconductor cost as well as relatively low weight, due to the efficient use of both superconductor and iron.

19 Claims, 4 Drawing Sheets

ULTRASHORT CYLINDRICAL SHIELDED ELECTROMAGNET FOR MAGNETIC RESONANCE IMAGING

This invention is in the field of electromagnets, and is more particularly directed to a shielded superconducting electromagnet for use in magnetic resonance imaging.

BACKGROUND OF THE INVENTION

High magnetic field electromagnets have become important elements in various types of equipment over recent years. One important type of such equipment is medical imaging equipment, such as the type commonly referred to as magnetic resonance imaging (MRI) equipment. This equipment utilizes the mechanism of nuclear magnetic resonance (NMR) to produce an image, and accordingly imaging systems operating according to this mechanism are also commonly referred to as NMR imaging systems.

As is well known in the field of MRI, a high DC magnetic field is generated to polarize the gyromagnetic atomic nuclei of interest (i.e., those atomic nuclei that have nonzero angular momentum, or nonzero magnetic moment) contained within the volume to be imaged in the subject. The magnitude of this DC magnetic field currently ranges from on the order of 0.15 Tesla to 2.0 Tesla; it is contemplated that larger fields, ranging as high as 4.0 to 6.0 Tesla, may be useful in the future, particularly to perform spectroscopy as well as tomography.

The volume of the subject to be imaged is defined by the application of a gradient magnetic field in combination with the DC field. As the gyromagnetic nuclei in the defined volume will have a common resonant frequency different from atoms outside of the volume, modulation of the gradient field allows sequential imaging of small volumes. The images from the small volumes are then used to form a composite image of the larger volume, such as the internal organ or region of interest.

Imaging is accomplished in MRI by using the nuclear magnetic resonance mechanism in gyromagnetic atomic nuclei in the subject. The MRI apparatus uses an oscillator coil to generate an oscillating magnetic field that is oriented at an angle relative to the DC field, and that has a frequency matching the resonant frequency of the atoms of interest in the selected volume. Frequencies of interest in modern MRI are in the radio frequency range. The MRI apparatus also includes a detecting coil in which a current can be induced by the nuclear magnetic dipoles in the volume being imaged.

In operation, as is well known, the magnetic dipole moments of those atoms in the volume which are both gyromagnetic and also resonant at the frequency of the oscillating field are rotated from their polarized orientation by the resonant RF oscillation by a known angle, for example 90°. The RF excitation is then removed, and the induced current in the detecting coil is measured over time to determine a decay rate, which corresponds to the quantity of the atoms of interest in the volume being imaged. Incremental sequencing of the imaging process through the selected volume by modulations in the gradient field can provide a series of images of the subject that correspond to the composition of the subject. Conventional MRI has been successful in the imaging of soft tissues, such as internal organs and the like, which are transparent to X-rays.

The strength of the DC magnetic field determines many attributes of the MRI process and results therefrom. A higher DC magnetic field can be used to resonate the gyromagnetic nuclei of elements other than hydrogen, so that in-vivo spectroscopy may be performed (in addition to tomography, or imaging). Furthermore, it is also well known in the art that the spatial resolution of MRI tomography improves as the strength of the available magnetic field increases. It is therefore desirable to provide MRI equipment with extremely high DC magnetic fields, such as 1.5 Tesla or greater.

Superconducting coils have generally been required to produce such extremely large magnetic fields, due to the large ampere-turns necessary to generate such fields. The superconducting material and accompanying cryogenic systems in such magnets add significantly to the cost of the imaging equipment. In addition, the size and weight of the MRI apparatus generally increases with the DC field strength of the magnet, as the weight and size of the magnet will increase with its DC field strength. Some conventional MRI magnets are sufficiently heavy (e.g., on the order of twenty tons) as to limit the installation of the MRI apparatus to a basement or ground floor laboratory.

High field electromagnets also generate high fringe fields extending away from the bore of the magnet. These high fringe fields can cause upset or erroneous operation of electrical equipment located near the magnet. As a result, the electronic equipment must be located either in a separate room from the apparatus, or behind a ferromagnetic shield away from the apparatus (or both, in the case where the room walls include iron shielding).

In one type of conventional superconducting magnet, electrical shielding surrounds the magnet bore to confine the field into a closed magnetic flux loop, and thus reduce the fringe magnetic field. Such electrical shielding is implemented by way of outer coils surrounding the main field-generating coils that conduct current in the opposite direction from that of the main field generating coils. The reverse polarity in the shielding coils generates a magnetic field that opposes the main field generated by the inner set of coils at locations outside of the bore, thus reducing the fringe field. However, the field generated by the shielding coils also tends to weaken the main field within the bore, and reinforce the field in the space between the main coil and the shielding coils.

An example of a conventional superconducting magnet which relies substantially on active superconducting shielding loops is described in U.S. Pat. No. 4,595,899. The magnet disclosed in this reference has a set of three driving coils surrounded by three shielding coils, with the current through the shielding coils adjusted to exactly cancel the dipole outside of the magnet. This reference further discloses the use of external ferromagnetic shielding located around the shielding coils to assist in further shielding. In this magnet, however, the bulk of the shielding is disclosed as effected by the outer shielding coils, considering the precise calculation of the dipoles set up by the driving coils and by the shielding coils, by which the main and opposing fields were matched to effect good shielding.

As indicated in U.S. Pat. No. 4,595,899, and as is true for other conventional electrically shielded magnets, any ferromagnetic shielding used in the magnet is generally located some distance away from the magnet bore. Such placement is intended to limit the effect of iron on the shape and uniformity of the magnetic field in the bore, because, as is well known in the art, iron or other ferromagnetic material near the bore will non-linearly affect the field within the bore, especially at fields above the threshold of magnetic saturation for iron at about 1.0 to 1.3 Tesla. As a result, the sole effect of the iron in these conventional magnets is to provide fringe field shielding at some distance from the magnet, with minimal effect on the field within the bore intended. In some cases, the ferromagnetic shield is located as far away from the bore as to be within the walls of the room surrounding the magnet (or MRI apparatus containing the magnet). This distancing of the ferromagnetic material from the bore causes significant problems in use of the magnets and equipment, either requiring large "footprints" for the magnet and its shielding, or requiring the specially constructed rooms to house the magnet or NMR equipment, either approach resulting in high cost and poor space utilization.

Examples of other prior magnets used in MRI are described in U.S. Pat. No. 4,612,505, in which shielding is accomplished by way of magnetic soft iron rods, conducting coils, or both. In particular, FIG. 3 of U.S. Pat. No. 4,612,505 discloses the use of a pair of relatively large superconducting shielding coils disposed outside the magnet. In addition, FIG. 4 of this reference illustrates a magnet having a shielding sleeve of magnetic soft iron, and shielding coils disposed outside thereof. The magnets disclosed in this reference have relatively low field strengths, such as on the order of 0.25 to 0.3 Tesla, and somewhat high fringe fields, such as 10 gauss or greater at a distance of three meters from the magnet axis.

U.S. Pat. No. 5,012,217, issued Apr. 30, 1992, describes yet another prior superconducting magnet utilizing a combination of active and passive shielding. This reference discloses the placement of a passive ferromagnetic shield around the main driving solenoid, but within the shielding solenoid (which generates the opposing magnetic field). This construction apparently requires that the large mass of the ferromagnetic shield be placed within the cryostat, substantially increasing the cryogenic load and, accordingly, the cost of maintaining the superconducting coils at superconducting temperatures.

In conventional magnets utilizing electrical shielding, either alone or in combination with ferromagnetic shielding, the cost of superconducting material for the outer coils is on the same order as that for the inner driving coils. The cryogenic load is also quite large for superconducting actively shielded magnets, due to the additional superconductors. In addition, it is believed that it is difficult to achieve uniformity of the magnetic field within the bore of the magnet where shielding is accomplished by cancellation of opposing fields, particularly where the desired magnetic field is 1.5 Tesla or greater.

As such, other prior work has been done in the field of superferric shielded superconducting magnets, as described in U.S. Pat. No. 4,783,628 (issued Nov. 8, 1988) and in U.S. Pat. No. 4,822,772 (issued Apr. 18, 1989), both incorporated herein by this reference and commonly assigned with this application. The magnets described in these patents utilize passive shielding of ferromagnetic material, such as iron, configured in such a manner that the shielding is superferric. Superferric shielding refers to the use of ferromagnetic material which affects the field within the magnet bore, particularly to enhance the field. As described in these patents, these superferric shielding concepts are useful even for magnetic fields significantly larger than the saturation threshold for the ferromagnetic material at which non-linear effects begin (e.g., above 1.0 to 1.3 Tesla for iron), and up to larger field strengths on the order of 4 Tesla. The construction of the magnets described in these patents provide a highly efficient magnet, considering the magnetic field strength as a function of the current conducted in the superconducting loops. Furthermore, the shielding is accomplished in such a manner that the uniformity of the field in the magnet bore is very high, even at very strong magnetic fields such as on the order of 4 Tesla, and with minimal fringe field (5 gauss at 50 to 100 cm from the outer wall of the bore).

Additional discussion of the effect of iron on the field within the magnet bore is presented in Siebold, et al., "Performance and Results of a Computer Program for Optimizing Magnets with Iron", *IEEE Trans, Magnetics*, Vol. 24, No. 1 (IEEE, January 1988), pp. 419–422. As particularly noted in FIG. 3 of this article, the coil system must be designed and adapted relative to the iron yoke in order to provide a uniform field in the bore.

The weight and size of the superferric shielded magnets described in U.S. Patent Nos. 4,783,628 and 4,822,772 can be quite substantial, however, such as on the order of 35 to 130 tons (as compared with actively shielded magnets weighing on the order of 20 tons). As a result, when used in medical equipment such as NMR stations, the "footprint" required for installation of such a magnet, as well as the weight-bearing capability of the floor of the room, are both significant. It is, of course, desirable to reduce the physical size and weight of NMR equipment, thus reducing the cost of the NMR laboratory. Besides the large footprint of conventional NMR magnets, it has been observed that many patients are uncomfortable when placed in magnets of such length, as the patient's entire body is generally disposed within the magnet during much of the imaging procedure. Indeed, conventional cylindrical NMR magnets have been referred to as "tunnel" magnets, representing the sensation perceived by the human subject when placed inside for an imaging procedure. It is therefore also desirable to provide a high magnetic field magnet for purposes of NMR which has good field homogeneity, but where the axial length of the bore is as short as possible.

By way of further background, it should be noted that the driving coils for magnets such as described in the above-referenced U.S. Pat. Nos. 4,783,628 and 4,822,772 are cylindrical in shape, so that a uniform magnetic field is provided over a portion of the axial length of the bore. As described, for example, in U.S. Pat. Nos. 4,587,490 and 4,590,428, and in Everett, et al., "Spherical coils for uniform magnetic fields," *J. Sci. Instrum.*, Vol. 43 (1966), pp. 470–74, it is also known to provide spherical or quasi-spherical coil arrangements to produce a homogeneous magnetic field within the bore.

In addition, it is also known to provide error, or trim, coils in conventional iron-shielded magnets to provide adjustment of the homogeneity of the magnetic field within the bore. One example of such a magnet is described in U.S. Pat. No. 4,490,675, in which the error coils are disclosed as being within the soft iron cylindrical shield. U.S. Pat. Nos. 4,590,428 and 4,587,490 also disclose NMR or MRI magnets including main and error coils within an iron cylinder.

By way of further background, U.S. Pat. No. 4,924,185 discloses another cylindrical superconducting magnet. As disclosed therein, the sense of oppression on the part of the patient is reduced as the ratio of bore length to bore diameter is below 1.90.

Copending application Ser. No. 715,552, filed Jun. 14, 1991, entitled "A Compact Shielded Superconducting Electromagnet", incorporated herein by this reference and commonly assigned herewith, describes another cylindrical superconducting magnet which advantageously uses a combination of superferric shielding outside of the shielding coils. The magnet disclosed therein thus can be shorter in length while still providing high DC field in the bore and low fringe field away from the magnet.

As noted above, an important use of MRI is in the medical context, where human patients are placed within the DC magnetic field for the imaging of internal organs. Particularly for patients who are seriously ill, it is essential that the magnet be able to receive the patient without requiring disconnecting life support or monitoring conduits from the patient. Medical personnel must also be able to access the patient during the procedure. Furthermore, many patients become anxious or otherwise uncomfortable when placed within conventional MRI equipment, particularly of the cylindrical type where the bore is on the order of 2 meters long, such as in the case of the conventional magnets described hereinabove.

Furthermore, as noted above, it is also highly desirable that the weight and "footprint" of the magnet be minimized so that the MRI apparatus may be located in conventional and reasonably sized laboratory space throughout the medical facility, and not limited to installation on a ground floor due to the weight of the apparatus. Furthermore, it is desirable that the fringe field be sufficiently low that electronic monitoring equipment and other instrumentation may be kept in the same room as the MRI apparatus, and without requiring special shielding in the walls or an excessively large room.

It is therefore an object of the present invention to provide an extremely compact superconducting magnet having a high degree of effective shielding.

It is a further object of the present invention to provide such a magnet having a large aperture into which a patient may be placed.

It is a further object of the present invention to provide such a magnet having relatively light weight and low cost.

It is a further object of the present invention to provide such a magnet which can be fabricated using a single cryostat.

Other objects and advantages of the present invention will be apparent to those of ordinary skill in the art having reference to the following specification together with the drawings.

SUMMARY OF THE INVENTION

The invention may be implemented in a cylindrical superconducting magnet utilizing the combination of superferric shielding together with active shielding coils. The shielding coils are placed outside of the superferric shield, but at a radius from the bore within that of the superferric shield and at the ends of the superferric shield, replacing the iron end plate of conventional superferric magnets. As a result, the superferric shield is located extremely close to the bore, and within the gap of the shielding coils. The shielding coils may be located within a single cryostat with the main coils, and the main coils may be formed on bobbins of constant radius, thus significantly reducing the manufacturing cost of the magnet. The resulting magnet may thus generate high fields, above the saturation threshold of iron, at high uniformity within the bore as suitable for MRI, but with low fringe fields and with low total weight.

DETAILED DESCRIPTION OF THE PREFERRED EMBODIMENTS

Figure 1:
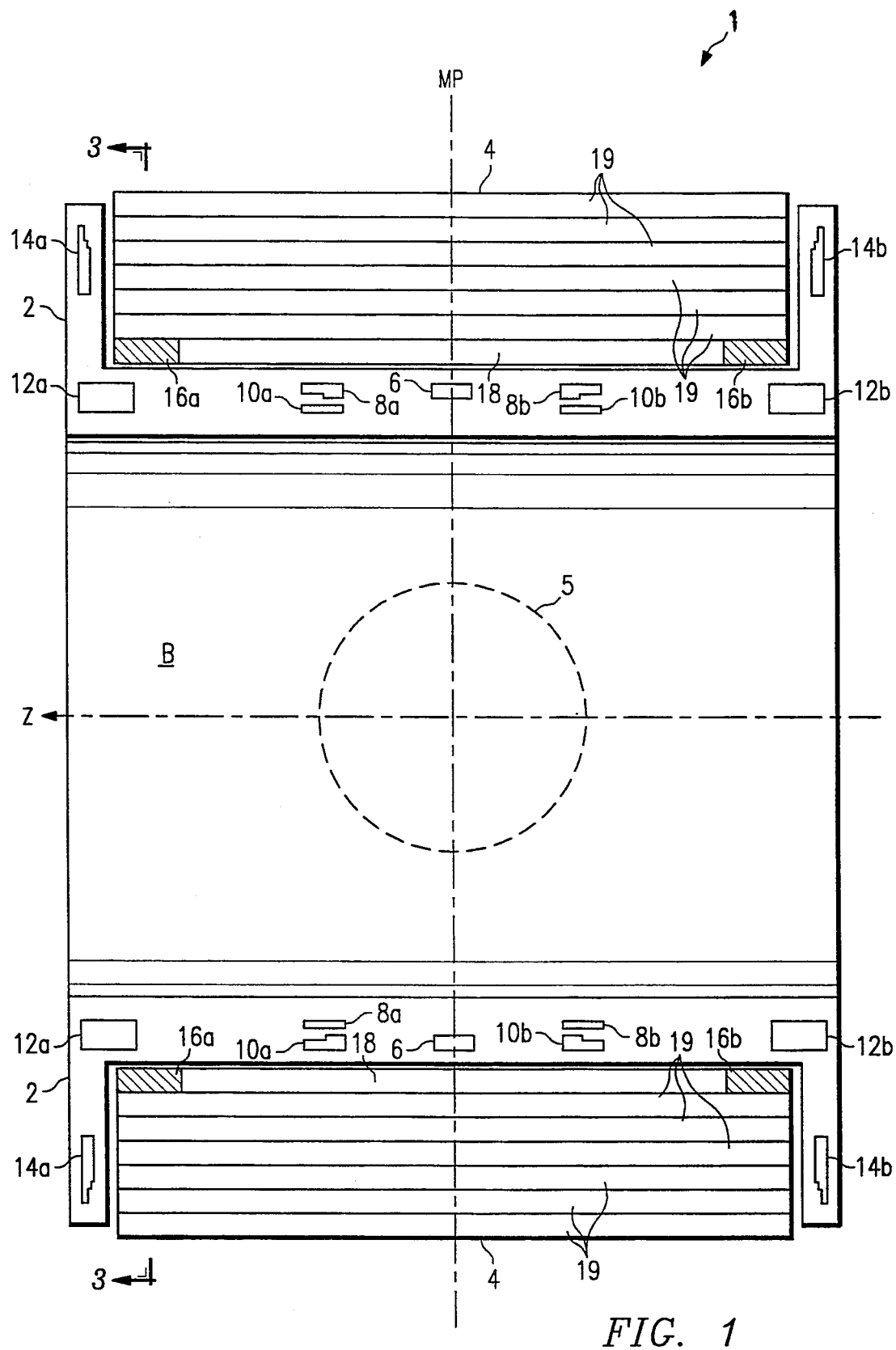
FIG. 1 is an axial cross-sectional diagram, in block form, of a superconducting magnet according to the preferred embodiment of the invention.

Referring first to FIG. 1, superconducting magnet 1 according to the first embodiment of the invention is illustrated in cross-section. Magnet 1 is intended to generate high DC magnetic fields, such as on the order of 2.0 Tesla, for use in an MRI apparatus of the cylindrical type, such as described in copending application Ser. No. 715,552, filed Jun. 14, 1991, entitled "A Compact Shielded Superconducting Electromagnet", incorporated herein by this reference and commonly assigned herewith. As such, the cross section of FIG. 1 illustrates two cross-sectional portions of the cylinder, disposed about cylindrical bore B having axis Z, and symmetric both relative to axis Z and also a midplane MP. Sphere 5 within bore B indicates the volume within which the DC magnetic field generated by superconducting magnet 1 of the present invention is to be highly uniform, deviating on the order of 25 ppm or less therewithin. As such, sphere 5 indicates the volume to be imaged by way of MRI by the apparatus, and in this example is approximately 25 cm in radius.

Figure 2:
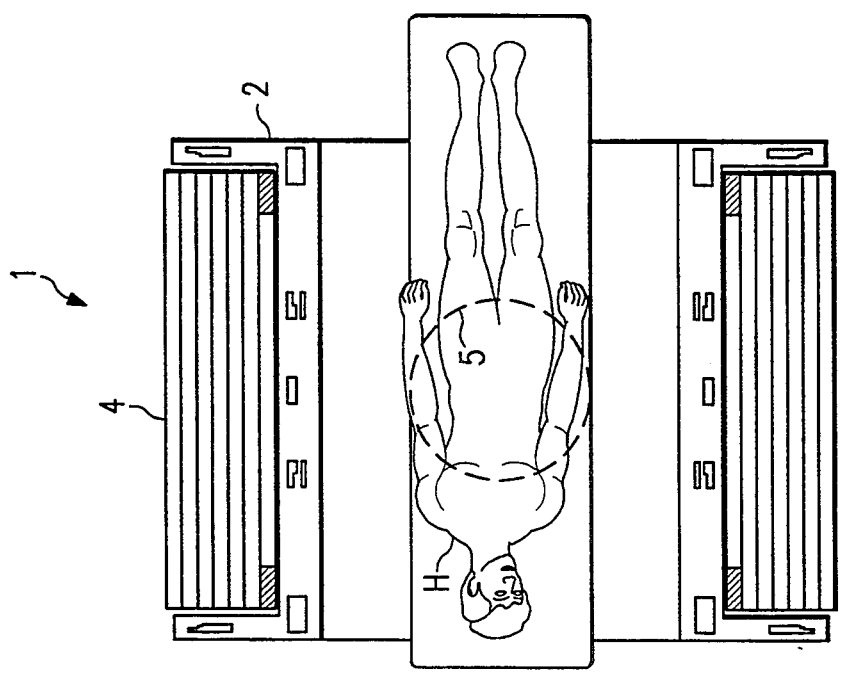
FIG. 2 is an axial cross-sectional diagram of the magnet of FIG. 1, illustrating its relationship relative to a human subject, as used in the magnetic resonance imaging context.

FIG. 2 illustrates magnet 1 as used for the MRI of a human subject H disposed therewithin. As shown in FIG. 2, sphere 5 is intended to be of sufficient size to enable imaging of a meaningful portion of human subject H, such as an internal organ. According to this embodiment of the invention, the length of bore B is on the order of 1.5 meters, and the diameter of bore B is on the order of 1.0 meters. As will be discussed in further detail hereinbelow, these dimensions allow for a relatively high level of comfort for human subject H, and allows for continuous access of human subject H by way of life support systems, instrumentation and monitoring systems, as well as human intervention by medical personnel.

Magnet 1 includes cryostat 2, within which are located sets of superconducting coils for generating the axial DC magnetic field in bore B, and also for providing the shielding function. As will be described in further detail hereinbelow, driving coils 6, 8a, 8b, 10a, 10b, 12a and 12b are located within cryostat 2 near bore B, for generating the DC axial magnetic field within bore B. Shielding coils 14a, 14b are located at the ends of magnet 1 at a larger radial distance from axis Z from driving coils 12a, 12b, respectively, and each carry current in the opposite direction from that in driving coils 6, 8, 10, 12. Cryostat 2 is preferably formed of stainless steel, such as 304L stainless steel, of sufficient strength to allow for its interior to be pumped down to the desired vacuum when chilled to superconducting temperatures, and to provide the desired structural support for the bobbins within which the superconducting coils are placed as well as the ducting for the cryogenic coolant. According to this embodiment of the invention, as will be described in further detail hereinbelow, a single cryostat 2 contains both the driving coils 6, 8, 10, 12 and shielding coils 14 of this superconducting magnet.

A cryogenic unit (not shown) is provided with magnet 1 for chilling driving coils 6, 8, 10, 12 and shielding coils 14 to the necessary temperature to maintain the wire material in a superconducting state. For example, where the superconducting wire is formed of a niobium titanium alloy, the upper limit on the superconducting temperature is 9.2° K. An example of a cryogenic unit capable of maintaining such temperature is a model CGR511-4.5 manufactured and sold by CVI, Inc., and uses liquid helium as the coolant fluid.

The detailed construction and current for coils 8, 10, 12, 14 of superconducting magnet 1 will be described in further detail hereinbelow.

Figure 3:
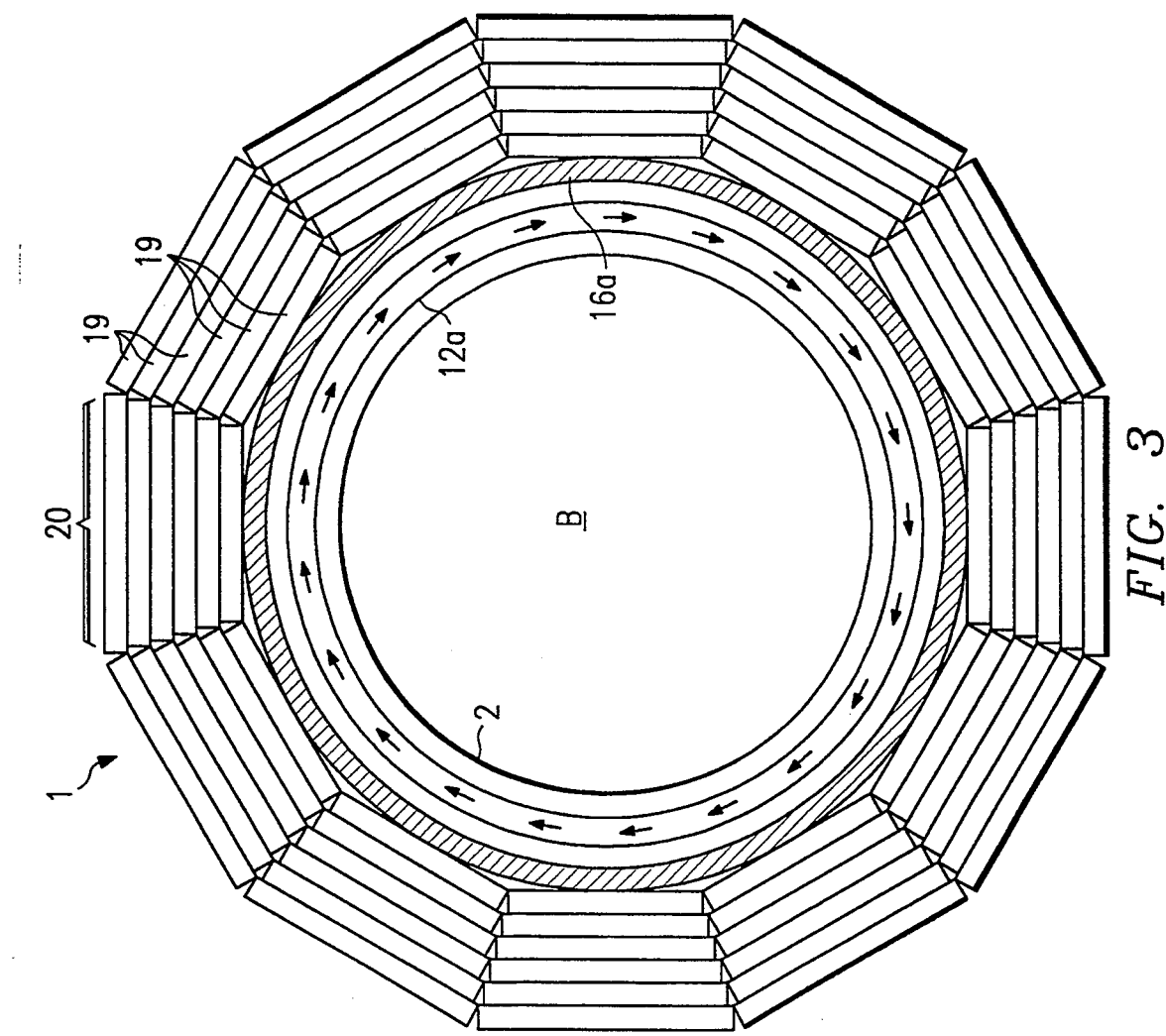
FIG. 3 is a radial cross-sectional diagram of the iron shielding for the magnet of FIG. 1.

Referring to FIGS. 1 and 3 in combination, superconducting magnet 1 according to this embodiment of the invention further includes flux return 4 disposed cylindrically within the gap in cryostat 2, between shielding coils 14a, 14b. As shown in FIG. 3, flux return 4 is constructed in a plurality of segments 20 surrounding cylindrical bore B, each segment 20 defining an arc of the circular cross-section of the magnet. Each segment 20 including a plurality of parallel adjacent steel plates 19, each of which extends the length of flux return 4 parallel to axis Z. The preferred material of plates 19 is 1008 steel, which is ferromagnetic as is well-known; as such, flux return 4 according to this embodiment of the invention is substantially an iron flux return. The width of plates 19 increases with radial distance from axis Z to substantially fill the volume within the arc defined by its segment 20. In this example, twelve segments 20 of parallel plates 19 surround bore B.

Plates 19 within a segment 20 are secured to one another and to rings 16a, 16b on either end of the magnet, for example by way of bolts. Rings 16a, 16b are machined rings of 1008 steel or any other high strength ferromagnetic material, and include the appropriate holes to allow for plates 19 in each segment 20 to bolt thereto. For each segment 20, an additional steel plate 18 is bolted to rings 16a, 16b, located therebetween and thus having a radial distance from axis Z equal to that of rings 16a, 16b; plate 18 thus adds structural strength as well as adding a flux path in flux return 4 between rings 16a, 16b, in addition to that of plates 19. It is preferable that rings 16a, 16b be formed by way of precision machining; however, the present invention allows for plates 18, 19 to be fabricated by less costly, lower precision methods such as flame cutting.

By way of example, iron flux return 4 according to this embodiment of the invention has an inner radial edge (i.e., the inner side of plate 18) located at a radial distance of approximately 68 cm from axis Z. The outer edge of flux return 4 (i.e., the outer side of the top plate 19) is located at a radial distance of approximately 99 cm from axis Z. The overall length of flux return is approximately 130 cm. For 1008 steel, according to this example, the total weight of iron flux return 4 is approximately 16.6 tons.

Referring back to FIG. 1, the construction and location of driving coils 6, 8, 10, 12 and shielding coils 14 will now be described in detail. As noted hereinabove, driving coils 6, 8, 10, 12 are each disposed near bore B, within the inner radius of flux return 4, and all carry current in the same direction to generate the desired magnetic field; for example, the direction of current flow in driving coils 6, 8, 10, 12 is out of the page at the top of FIG. 1 and into the page at the bottom of FIG. 1 (or clockwise in the cross-section of FIG. 3). As such, driving coils 6, 8, 10, 12 together form a driving solenoid for generating a magnetic field in bore B, having field lines (or flux lines) oriented parallel to axis Z of bore B.

Shielding coils 14a, 14b are each disposed at the ends of the magnet, outside of flux return 4, such that flux return 4 is disposed within the axial gap between shielding coils 14a, 14b. The direction of current flow through shielding coils 14a, 14b is opposite that in driving coils 6, 8, 10, 12 (i.e., into the page at the top of FIG. 1 and out of the page at the bottom of FIG. 1, or counter-clockwise in the cross-section of FIG. 3), so that shielding coils 14a, 14b generate a magnetic field of the opposite polarity of that generated within bore B.

Conventional design techniques may be used to determine magnitude of the current in each of the driving coils 6, 8, 10, 12 and in shielding coils 14, of magnet 1 of FIGS. 1 and 3. According to the most widely-used design methodology, the location of sets of driving coils (and shielding coils, if desired) is first determined, and the currents are then defined by way of computer-aided modeling. The preferred case for such design is for a magnet that is axially symmetric and symmetric about its midplane, thus ensuring that only even zonal harmonic coefficients are produced. The current density in each coil is presumed to be the same, and not a function of location (i.e., the current density is independent of radial or axial distance from the target sphere). Once the coil locations are determined in this prior method, the designer adjusts the current through each set of coils until the higher order zonal harmonic coefficients ($C_2$, $C_4$ and higher) vanish, so that the zero order zonal harmonic coefficient $C_0$ alone determines the desired field in the bore. Improvements to this prior design technique included finite element (FE) modeling and design for the case of iron shielded magnets, and Monte Carlo random search techniques for actively shielded magnets, each used to determine the currents in the defined coil locations.

It should be noted that this prior technique may be used in order to set the current magnitudes in the driving coils 6, 8, 10, 12, and shielding coils 14, of magnet 1 according to the preferred embodiment of the invention. However, the location and current magnitude in each of driving coils 6, 8, 10, 12, and in shielding coils 14, is preferably determined according to the "structured coils" methodology, as described in Pissanetzky, "Structured coils for NMR applications" (accepted for publication in *IEEE Trans. Magnetics*; a copy thereof presented in Appendix A to this application), incorporated herein by this reference.

The structured coils methodology significantly differs from the conventional design methodology, as it allows the current density within the coils to vary as a function of location, i.e., as a function of both axial and radial distance from the target sphere. For purposes of modeling, the current density is defined as a piecewise constant approximation, with the coils divided into small sections of equal rectangular cross-section (i.e., the coil elements), each having its own current. Target locations, such as sphere 5 in FIG. 1, are selected, and the desired attributes selected (field magnitude and direction); in addition, target locations outside of bore B may be selected, to allow the optimization process to also consider minimization of the fringe field in setting the coil currents. The coil element currents then become the unknowns of a problem where the field at the target locations are known, and in which certain constraints in the current density within the coil elements are preset, considering the current capacity of the superconducting material and other physical limitations. In the typical case, the current density constraints in the coil elements define a simplex in the multi-dimensional space of unknown currents, allowing the currents to be solved by way of the well-known Simplex method of mathematical quadratic programming.

It has been found that the structured coils methodology is particularly useful in that it allows for most currents in the coil elements to be set at their upper or lower bound. When active shielding is used, as in magnet 1, the lower bound is a negative current density value; when only iron shielding is used, the lower current density boundary is effectively zero. Furthermore, it has been found that the structured coils approach causes "clustering" of like current magnitudes, which is advantageous as it provides for the physical construction of the coils as a few compact coils, generally of irregular shape but with a constant current density therein. As a result, the coils in magnet 1 may be implemented as a few sections of superconductor coils of uniform winding, taking advantage of the uniform current density within each section.

As described in the Pissanetzky article incorporated herein by reference, it is preferable to utilize the structured coils methodology by using an "approaching target" strategy, where a target value is selected for each target location, and where the difference between actual field and the target field value is minimized by way of least squares minimization of a quadratic error form. This minimization is facilitated in the cylindrical case, such as in magnet 1 of the present invention, where the number of coil elements is much larger than the number of target locations. As noted above, maximum and minimum current density limits are set for each coil element, defining a non-empty simplex. Simplex minimization of the quadratic error form is then performed, such as by way of the readily available computer software described in Reports AERE-R 9185, TP 401, R 6370 and TP 528, in the Hatwell Subroutine Library, Computer Science and Systems Division, Atomic Energy Research Establishment, Harwell, Oxfordshire, England (1984), incorporated herein by this reference. This minimization continues until the current density constraints that prevent further reduction are identified; these constraints are adjusted, and the minimization performed again.

While theoretically there are no guarantees that a practical solution is present for any particular arrangement of coil elements and target locations, it has been found that sufficiently large coils carrying currents achievable by superconductivity can provide high fields (on the order of 2.0 Tesla) of acceptable uniformity (less than 25 ppm) in a cylindrical magnet. Furthermore, as noted above, the effect of clustering, where adjacent coil elements tend to one of the current density limits, is particularly advantageous in physical realization of the design, as it allows for coils to be constructed that, while of irregular shape, have a constant current density therewithin.

As noted hereinabove, it is contemplated that other design techniques, including conventional methods that specify the location of cylindrical magnet coils in an symmetric fashion about the axis and midplane with current densities independent of location, followed by adjusting the current until the higher order zonal harmonic coefficients vanish, may be used to design a magnet according to the present invention. However, it is believed that such conventional techniques would not be capable of reducing the bore length to the extent achievable by way of the structured coils approach described hereinabove, and in the Pissanetzky article incorporated herein by reference.

Accordingly, the detailed design of magnet 1 was determined by way of the structured coils methodology, with the design goal being a magnet generating a DC magnetic field of 2.0 Tesla within a 1.0 meter diameter bore B, with uniformity of 25 ppm or less within a 25 cm radius sphere 5. The fringe field design goal was a 5 gauss line 5 meters or less from the opening of bore B on either end. In addition, for cylindrical magnets such as magnet 1 in this embodiment of the invention, the axial and mid-plane symmetry allows for the structured coils minimization to be done on a quarter magnet basis.

According to the structured coils method used to design this example of the magnet, 21 target locations were selected on the surface of sphere 5. In addition, for design of the proper shielding, in this example 15 target locations were selected outside of bore B, along a quarter ellipse having its semi-axes 4.8 meters from the center of sphere 5 in the axial direction (along axis Z), and 2.5 meters from the center of sphere 5 in the radial direction (perpendicular to axis Z). This quarter-ellipse definition of the target locations for the fringe field was selected as it resembled the shape of conventional 5 gauss lines for cylindrical MRI magnets.

In performing the quadratic minimization of the field error using target locations both within the bore and outside of the bore, it is useful to include a weighting factor in the error form. This weighting factor comprehends the tradeoff between high uniformity field in the bore B versus low fringe effects. Accordingly, the error form Q minimized in the design of magnet 1 according to this embodiment of the invention is as follows:

$$Q = \sum_{i=1}^{21} W_i(B_{zi} - B_i^t)^2 + \sum_{i=22}^{36} p(B_{pi}^2 + B_{zi}^2)$$

where the set of $w_i$ is a set of weighting factors for weighting the effect of the target locations (i=1 to 21) within bore B, where the difference ($B_{zi} - B_i^t$) is the difference between the calculated field and the desired field at the ith target location in bore B, and where $(B^2_{\rho i}+B^2_{zi})$ is the square of the amplitude of the field (radial and axial components) at the target locations (i=22 to 36) outside the bore B, at which the fringe field is determined. The weighting factor p indicates the tradeoff between highest bore field quality (p=0) and best shielding (p large). Empirical study has indicated that a value of $10^{-e}$ $10^{-5}$ is suitable for magnets to be used in MRI applications.

Iron flux return 4, as used in this first embodiment of the invention, may be considered in the design of the coils even though iron presents significant non-linear effects to the magnetic field. Such consideration may be made by first optimizing coil shapes for a bore field strength without the iron flux return, and then adding the field enhancement expected from the use of iron in the magnetic loop. After adding the field enhancement factor, the currents in the defined coil shapes are then optimized, for field uniformity, using conventional finite element methods (e.g., the well-known OPUS computer program). The result is successful so long as the current adjustments are not so significant that the coil shape optimization is defeated.

Referring back to FIG. 1, the location, size, and current of the coils 6, 8, 10, 12, 14 will now be described in detail for magnet 1 according to this embodiment of the invention, as defined by the structured coils methodology described hereinabove and in the Pissanetzky reference. While each of the coils 6, 8, 10, 12 14 will be described hereinabove for this particular example, it is expected that variations in the size, number, location and current will occur in the practice of the present invention, particularly as the dimensions or field strength of the magnet change, or as the particular design criteria (e.g., tradeoff between high quality field and minimal fringe field) are changed. As such, the following description is by way of example only, and is not to be construed in a limiting sense.

Superconducting coils 6, 8, 10, 12, 14 in this example are constructed according to conventional design. For example, the SCOK superconducting wire manufactured and sold by Outokumpu Copper (USA) Inc. of Glendale Heights, Illinois is believed to be particularly useful in a high field superconducting magnet of relatively short length, as in this example. The SCOK wire consists of 1.05 mm (O.D.) 2.32:1 Cu/NbTi wire, having a rating of 570 A at 6 Tesla fields; the capacity of this wire thus exceeds the 500 A current rating of conventional persistent switches. In addition, the coils 6, 8, 10, 12, 14 can use thinner diameter wire of the same composition quite successfully. The coils are insulated from one another in the conventional manner, and placed within conventional bobbins at the locations within cryostat 2 shown in FIG. 1.

In this example, for a 2.0 Tesla magnet, center driving coil 6 has a rectangular cross-section of approximately 7.2 cm (axial direction) by 1.8 cm (radial direction), with its inner edge located approximately 61.2 cm from axis Z. The current through center driving coil 6 in this example is approximately 401,360 amperes.

Outer intermediate coils 8a, 8b have their inner radial edge at approximately 61.0 cm from axis Z, and their inner axial edges at an axial distance of approximately 21.6 cm from the midplane MP of bore B. Outer intermediate coils 8a, 8b are each of irregular cross-section, having a major rectangular portion approximately 3.6 cm (axial) by 2 cm (radial), and a rectangular extension of approximately 3.6 cm by 1.3 cm extending therefrom in the axial direction away from the midplane MP of bore B. The orientation of the irregular cross-section of outer intermediate coils 8a, 8b are symmetric relative to the midplane MP of bore B. Each of outer intermediate coils 8a, 8b carry a current, in this example, of approximately 238,419 amperes.

Inner intermediate coils 10a, 10b are located radially inward of outer intermediate coils 8a, 8b, respectively, and have a rectangular cross-section of approximately 7.2 cm (axial) by 0.5 cm (radial), with its inner radial edge at a radial distance of approximately 58 cm from axis Z. The inner axial edge of each of inner intermediate coils 10a, 10b is approximately 21.6 cm from the midplane MP of bore B. The current carried by each of inner intermediate coils 10a, 10b is approximately 200,000 amperes.

End driving coils 12a, 12b are located near the outer edges of cryostat 2 from the midplane MP of bore B. Each of end driving coils 12a, 12b have a rectangular cross-section of approximately 10.8 cm (axial) by 5 cm (radial), and have their inner radial edges at a radial distance of approximately 58 cm from axis Z. The inner axial edges of end driving coils 12a, 12b are at approximately 61.2 cm from the midplane MP of bore B. End driving coils 12a, 12b, in this embodiment of the invention, carry the majority of the current for generating the DC magnetic field in bore B; in this example, the current through each of end driving coils 12a, 12b is approximately 1,624 million amperes.

As noted hereinabove, the polarity of the current through each of driving coils 6, 8, 10, 12 is the same. As a result, due to the large current therethrough, end driving coils 12a, 12b contribute most of the flux in bore B. Inner coils 6, 8, 10 contribute additional flux, of course, and adjust the field in bore B for optimal uniformity.

It should also be noted that the distance from axis Z of the inner radial edges of center driving coil 6, inner intermediate driving coils 10a, 10b, outer intermediate driving coils 8a, 8b, and end driving coils 12a, 12b, is substantially the same. As a result, the superconducting wire may be placed within bobbins wound about a single pipe, supplemented as needed to finely place the wire at the proper distance. This construction is in contrast to many conventional superconducting magnets of a spherical or quasi-spherical type, in which the center coils are at a significantly greater radial distance from the bore axis than the coils at the end, thus requiring bobbins of widely differing radii. Examples of such spherical magnets are described in U.S. Pat. No. 4,587,490, in U.S. Pat. No. 4,595,899, in Everett, et al., "Spherical coils for uniform magnetic fields," *J. Sci. Instrum.*, Vol. 43 (1966), pp. 470–74, and in copending application Ser. No. 715,552, filed Jun. 14, 1991, entitled "A Compact Shielded Superconducting Electromagnet", incorporated herein by this reference and commonly assigned herewith.

Because of the ability to use a single diameter pipe in this embodiment of the invention, the weight and volume of the iron in the magnet may be reduced from that otherwise necessary. In addition, the amount of superconducting material may be minimized, further reducing the cost of the magnet. Furthermore, the construction of the bobbins and the procedure for winding the superconductor thereabout are both simplified when a single diameter pipe is used.

Shielding coils 14a, 14b are also provided in this embodiment of the invention, for carrying current of the opposite polarity from that in driving coils 6, 8, 10, 12, thus injecting return flux into flux return 4. Shielding coils 14a, 14b are located radially outwardly from end driving coils 12a, 12b, respectively, and axially outwardly from flux return 4 relative to the midplane MP of bore B. The inner radial edge of each of shielding coils 14a, 14b is at a radial distance from axis Z of approximately 80 cm. Shielding coils 14a, 14b in this example each have irregular cross-sections that are oriented symmetrically relative to one another. The cross-section of each of shielding coils 14a, 14b includes a major rectangular portion of approximately 2 cm (axial) by 8 cm (radial); a first rectangular extension of 1.6 cm (axial) by 2 cm (radial) extends radially away from the major portion, with a second rectangular extension of approximately 0.8 cm (axial) by 2 cm (radial) extending radially away from the first rectangular extension. The symmetric orientation of the extensions is such that the outer axial edge of coils 14a, 14b is collinear.

The current conducted by each of shielding coils 14a, 14b is approximately 633,000 amperes, and is of the opposite polarity of the current in driving coils 6, 8, 10, 12, as noted above. As such, active shielding is provided by shielding coils 14a, 14b, such that the magnetic flux emanating from the axial openings of bore B is directed toward and injected into flux return 4, with minimization of the fringe field away therefrom.

Figure 4:
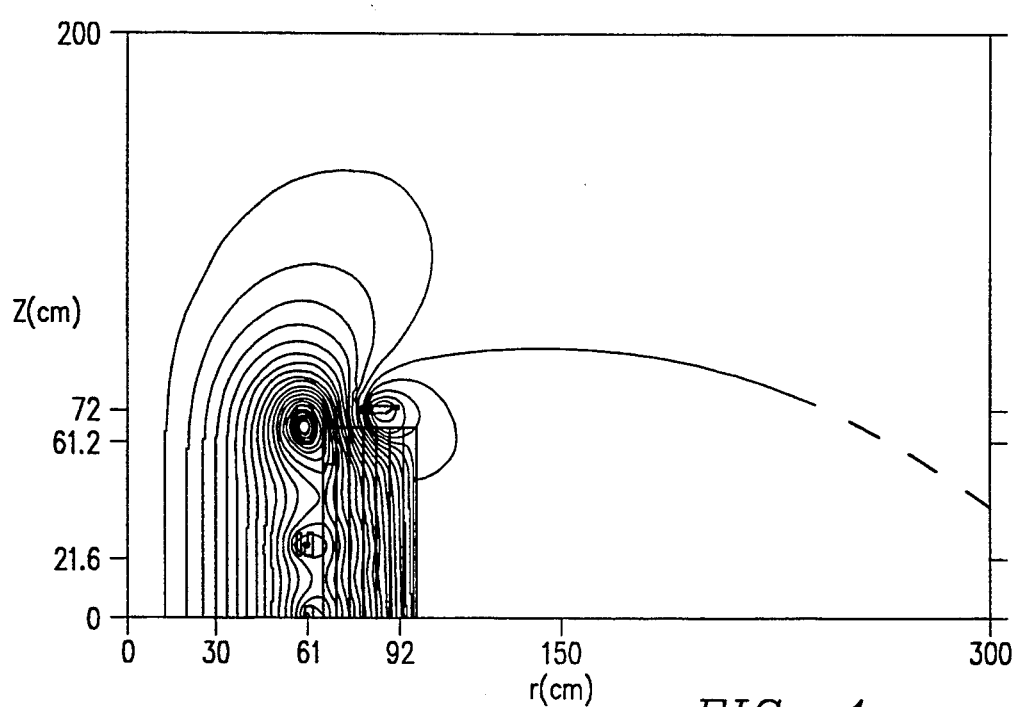
FIG. 4 is a plot illustrating the field lines of the magnet of FIG. 1, as simulated.

Referring now to FIG. 4, the field lines for magnet 1 constructed as described above relative to FIG. 1 are shown, based on finite element simulation of the field according to the OPUS computer program, available from Ferrari Associates, Inc. of Jacksonville, Florida. For purposes of simplicity of presentation (and of simulation), the field lines of FIG. 4 are illustrated for a quarter-magnet; the axial and mid-plane symmetry of magnet 1 according to this embodiment of the invention allow this quarter-magnet representation to accurately convey the field behavior.

As shown in FIG. 4, shielding coils 14a, 14b, located radially outside of end driving coils 12a, 12b, respectively, and located axially outward of flux return 4, inject the return magnetic flux into flux return 4 in a highly efficient manner. In addition, the field within bore B is highly uniform, as indicated by the straight field lines therein, parallel to one another, and spaced from one another in a manner inversely proportional to their radial distance from axis Z; the simulated field uniformity within sphere 5 is approximately 25 ppm. This particular simulation is for a magnetic field of 2.0 Tesla within bore B, as is suitable for advanced MRI with high resolution.

Figure 5:
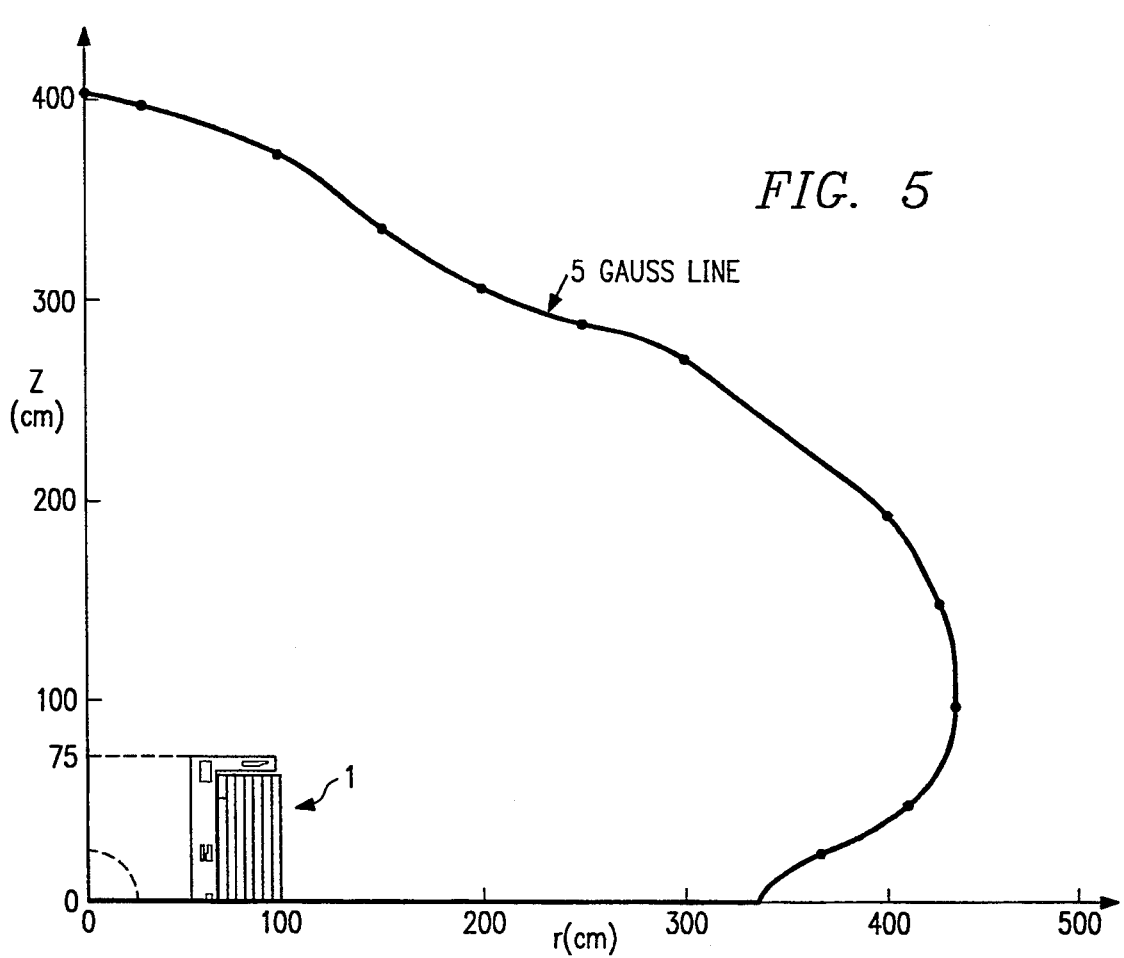
FIG. 5 is a plot illustrating the fringe field of the magnet of FIG. 1, as simulated.

Referring now to FIG. 5, the fringe field generated by magnet 1 according to this embodiment of the invention is illustrated, as simulated by the OPUS computer program noted above. FIG. 5 illustrates the location of the 5 gauss line, which is the conventional measure for shielding of superconducting magnets. As shown in FIG. 5, the 5 gauss line is approximately 4 meters from the midplane MP of bore B, or 3.25 meters from the end of cryostat 2. The maximum radial distance from axis Z of the 5 gauss line is approximately 4.4 meters, at a point approximately radially outward from the axial end of cryostat 2.

Accordingly, it is contemplated that the present invention is suitable for producing a superconducting magnet of compact dimensions, yet which produces an extremely high magnetic field (on the order of 2.0 Tesla) in the cylindrical bore, in a manner which is highly uniform over a volume of interest (25 ppm over a sphere of 25 cm radius), and which produces minimal fringe field (5 gauss line at 4.0 to 4.5 meters). This magnet is extremely compact, having a cryostat length of approximately 1.5 meters and a bore of 1.0 meters, thus allowing good patient access and reduced patient anxiety. The ratio of bore length to bore diameter obtained in magnet 1 according to this embodiment of the invention is therefore well below the top of the desired range of 1.00 to 1.90 for such magnets, as described in the above-referenced U.S. Pat. No. 4,924,185.

Furthermore, the cost and weight of the magnet so produced is relatively low as compared against other magnets. According to the present invention, the driving and shielding coils may be contained within a single cryostat, thus reducing the mechanical and cryogenic requirements of the magnet. Furthermore, the use of active shielding coils located outside of the flux return results in highly efficient injection of the return flux into the iron flux return, especially as compared against superferric magnets that relied on machined steel end plates for such injection.

In addition, the present invention allows for the iron flux return to be produced in a low cost manner. This is because the only iron parts that require precision machining according to this embodiment of the invention are rings 16a, 16b. Plates 18, 19 may be formed by less costly, and less precise, techniques such as flame cutting.

Furthermore, the use and location of the iron flux return 4 near the bore in this embodiment of the invention provides for other significant advantages. Firstly, the efficiency of the flux return is greatly improved over conventional magnets, due to shielding coils located axially outwardly from flux return 4; as such, the amount of iron required is much reduced over prior superferric magnets, which significantly reduces the weight of the overall magnet and its flexibility of use. For example, it is contemplated (by way of computer modeling) that the weight of iron flux return 4 in this embodiment of the invention is on the order of 16.6 tons, well below that of conventional iron shielded cylindrical magnets of 1.0 meter bore size.

In addition, iron flux return 4 is located outside of cryostat 2. As such, it can be readily disassembled for transportation, and reassembled upon arrival, providing a high degree of portability of the magnet as compared against conventional magnets that either have iron shielding located within the cryostat, or that require high precision installation and adjustment of the iron upon installation.

Furthermore, driving coils 6, 8, 10, 12 are only weakly coupled to one another according to this embodiment of the invention, due to the near presence of iron flux return 4. This weak coupling provides significant quench protection, as in the event that one of the coils enters a quench condition, it will receive very little flux from neighboring coils which would otherwise add energy to the quench. Since the vulnerability to quench is reduced according to the present invention, the current through the coils may be increased to closer to its maximum, further improving the efficiency of the magnet in generating high fields with little superconductor.

Furthermore, the presence of the shielding coils at the ends of the flux return, in place of ferromagnetic end pieces as in prior superferric and otherwise iron shielded magnets, improves the uniformity of the generated field. In conventional MRI systems having ferromagnetic end pieces or poles, eddy currents are induced in the end pieces by the gradient coils. These eddy currents, in turn, induce magnetic flux which perturbs the uniformity and stability of the gradient field. The absence of the end pieces in magnet 1 constructed according to the present invention eliminates such eddy currents and the resulting perturbations.

The present invention thus provides for many of the other benefits of iron shielded magnets, without the excessive weight and cost attributed to conventional iron shielded magnets. In this embodiment of the invention, iron flux return 4 isolates the bore field from externally generated magnetic fields. In addition, iron flux return 4 serves to enhance the magnetic field in the bore, reducing the current requirements for the driving coils. These advantages are obtained in the present invention by a magnet which has a relatively light weight, and which may be manufactured at relatively low cost.

While seven driving coils 6, 8, 10, 12 and two shielding coils 14 are provided in this example of the invention, it should of course be apparent to one of ordinary skill in the art that greater or fewer coils may be alternatively be provided, depending upon the particular design constraints for a superconducting magnet to be constructed, without departing from the scope and spirit of the present invention.

The above-described embodiment utilizes active shielding coils 14a, 14b to direct, or inject, the return magnetic flux into iron flux return 4. It is contemplated that other types of flux returns may be utilized in conjunction with the present invention. For example, it is contemplated that an active flux return, for example a superconducting solenoid, may be used in place of iron flux return 4 described hereinabove, in such cases where the reduction in weight of the magnet obtained in such a substitution outweighs the additional cost of superconducting material. In addition, it is contemplated that a combination of a passive ferromagnetic flux return with an active flux return may also be used in conjunction with the present invention, allowing for optimization of magnet weight and superconductor cost.

Figure 6:
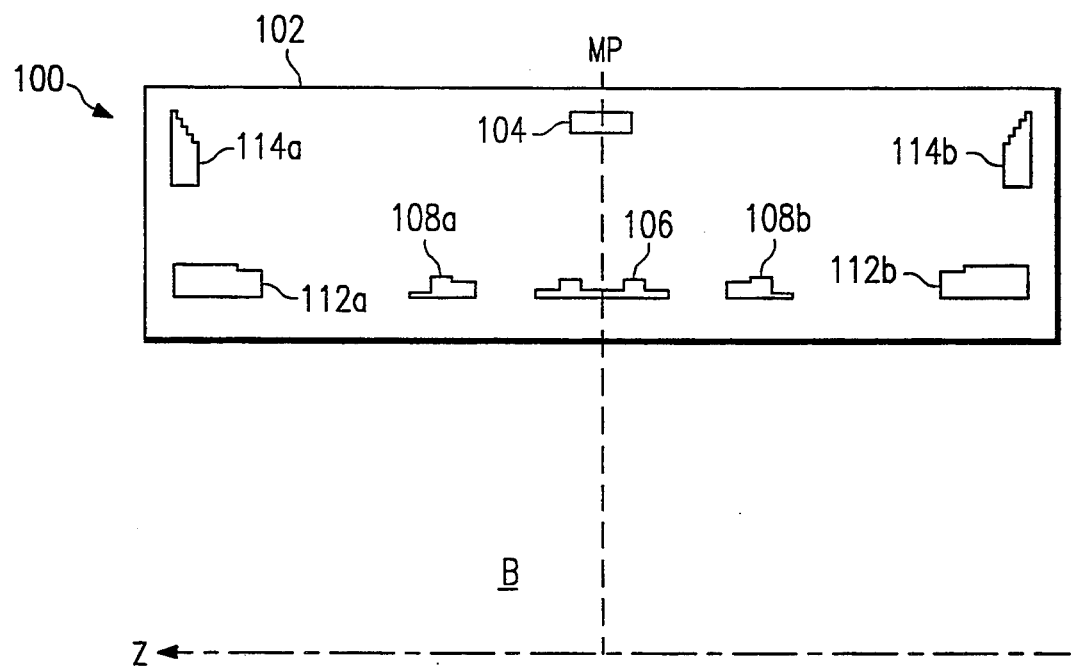
FIG. 6 is an axial cross-sectional diagram of one half of a superconducting magnet according to an alternative embodiment of the invention.

Referring now to FIG. 6, magnet 100 according to an alternative embodiment of the invention will now be described, in which an active flux return is provided in place of iron flux return 4 in the previously described embodiment. The cross-sectional view of FIG. 6 is of one-half of magnet 100; as described hereinabove relative to FIG. 1, magnet 100 is of the cylindrical type, symmetric about axis Z; in addition, the location, size and shape of the coils in magnet 100 is also symmetric about midplane MP, as shown in FIG. 6.

Cryostat 102 in magnet 100 of FIG. 6 is of a hollow cylindrical shape, and of conventional construction and shape for maintaining its internal volume at superconducting temperatures. As in the embodiment described hereinabove, a conventional cryogenic unit is provided with magnet 100 for appropriate cooling of the volume therewithin.

Within cryostat 102, magnet 100 includes center driving coil 106, intermediate driving coils 108a, 108b, and end driving coils 112a, 112b, each consisting of superconducting wire for conducting current of like polarity. End shielding coils 114a, 114b are also contained within cryostat 102, at opposing ends thereof and at a radial distance from axis Z outside of end driving coils 112a, 112b; as in the case of magnet 1 discussed hereinabove, end shielding coils 114a, 114b also consist of superconducting wire, and conduct current of opposite polarity from that conducted by driving coils 106, 108, 112.

In magnet 100 according to this alternative embodiment of the invention, an active flux return 104 is provided in place of iron flux return 4 (see FIG. 1). Active flux return 104 consists of a coil of superconducting wire, disposed at and symmetrically about midplane MP, at a radial distance from axis Z outside center driving coil 106. Active flux return coil 104 conducts current in the same direction as end shielding coils 114a, 114b, and thus in an opposite polarity to driving coils 106, 108, 112.

In this embodiment of the invention, as in magnet 1 described hereinabove, the location, shape, size and current density of each of coils 106, 108, 112, 114, 104 are determined according to the structured coils methodology described hereinabove and in the Pissanetzky article incorporated hereinto by reference. As a result, particularly resulting from the clustering effect, relatively small coils of irregular cross-section and having constant current density will likely result, optimizing the uniformity of the field in bore B while minimizing fringe field outside of bore B.

In this example of magnet 100, the inner radial edges of each of driving coils 106, 108, 112 are at substantially the same radial distance (approximately 58 cm) from axis Z. As such, a single pipe may be used within cryostat 102, about which bobbins for supporting coils 106, 108, 112 may be wound, supplemented as needed to finely tune the location. Center driving coil 106 has three thicknesses (in the radial direction): approximately 0.71 cm at the center at midplane MP, 2.86 cm at its thickest point, and 1.3 cm at its end locations. The overall axial width of center driving coil 106 in this example is approximately 21.5 cm, and the current it conducts is approximately 464,873 amperes.

Intermediate driving coils 108a, 108b each have their inner axial edge located at an axial distance of 21.6 cm from midplane MP, and each have an axial width of about 10.8 cm. Intermediate driving coils 108a, 108b also have three radial thicknesses (in this example), with the thinnest portion approximately 0.7 cm thick, its thickest portion approximately 3.6 cm thick, and its nearest portion to midplane MP approximately 2.5 cm thick. The current conducted by intermediate driving coils 108a, 108b is approximately 732,300 amperes each.

End driving coils 112a, 112b, as in the previously described embodiment provide the bulk of the direct field in bore B. Each of end driving coils 112a, 112b have their inner axial edge located at approximately 57.6 cm from midplane MP, and each have an axial width of approximately 14.4 cm. The thicker portions (radially) of end driving coils 112a, 112b are approximately 5.0 cm thick, and the thinner portions nearer midplane MP are approximately 4.9 cm thick. The current conducted by end driving coils 114a, 114b is approximately 2.104 million amperes.

End shielding coils 114a, 114b have a stair-step cross-section similar to end shielding coils 14a, 14b in magnet 1 of FIG. 1. The inner radial edges of end shielding coils 114a, 114b are at a radial distance of approximately 76 cm from axis Z, while the inner axial edges thereof are at an axial distance of approximately 68 cm from midplane MP; the axial width of each of end shielding coils 114a, 114b is approximately 4.0 cm. The radial thickness of the thickest portions of end shielding coils 114a, 114b (furthest from midplane MP) are approximately 12.6 cm; each coil 114a, 114b has three steps of approximately 1.4 cm in thickness provided so that the thinnest portions of end shielding coils 114a, 114b (nearest midplane MP) is approximately 15.0 cm. The current conducted by each of shielding coils 114a, 114b is approximately 1.197 million amperes, of opposite polarity from that conducted by driving coils 106, 108, 112.

Active flux return coil 104 in this embodiment of the invention is a coil of rectangular cross-section, disposed symmetrically at midplane MP and at a radial distance of approximately 85 cm from axis Z. Active flux return coil 104 is approximately 3.28 cm in radial thickness by 10.5 cm in axial width, and carries approximately 1,032,000 amperes of current, of the same polarity as end shielding coils 114a, 114b and opposite polarity from that conducted by driving coils 106, 108, 112.

Figure 7:
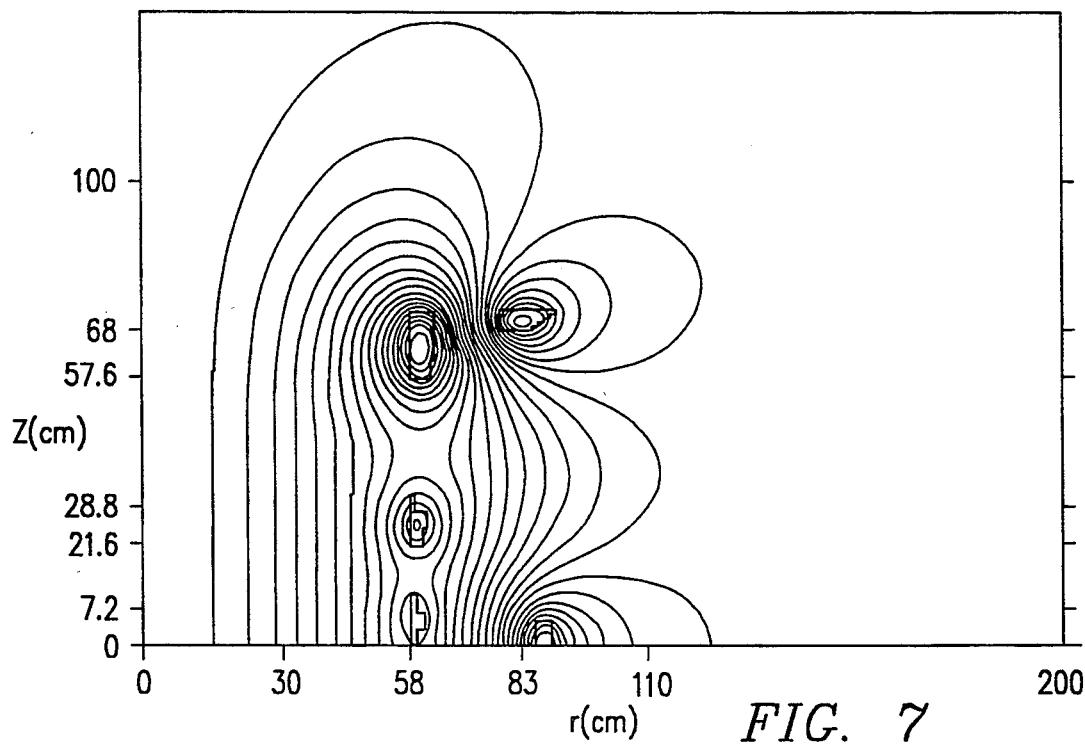
FIG. 7 is a plot illustrating the field lines of the magnet of FIG. 6.

The construction of magnet 100 according to this alternative embodiment of the invention provides a relatively high magnetic field in bore B of high uniformity, with relatively low fringe field away from bore B. As simulated by the OPUS program noted hereinabove, the field strength within bore B is approximately 2.0 Tesla, having a uniformity of approximately 14 ppm over a 25 cm sphere centered at the intersection of axis Z and midplane MP. The field lines simulated by the OPUS program are illustrated in FIG. 7. The OPUS program also simulated the fringe field from this embodiment of the invention as having the 5 gauss line at 5.7 meters from midplane MP along axis Z, and at a maximum of 2.5 meters from axis Z along the side of magnet 100.

Particularly due to the structured coils methodology discussed above and in the above-incorporated Pisanetzky article, the length of magnet 100 (including cryostat) is approximately 1.5 meters, as in the previously described embodiment. However, in contrast to magnet 1 described hereinabove having iron flux return 4, the weight of magnet 100 is extremely low, thus allowing a high degree of transportability and portability. Of course, as in the case with all actively shielded magnets (i.e., not having ferromagnetic shields), the magnetic field in bore B will be vulnerable to externally generated fields. In addition, the cost of superconducting material will, of course, be higher than that in magnet 1 described hereinabove.

It is contemplated that the fully actively shielded magnet 100 will be preferable relative to magnet 1 having an iron flux return 4 in some applications, and vice versa in others. The tradeoff between low weight and low superconductor cost will be made according to the particular application desired.

For optimization of this tradeoff, however, it is further contemplated that one may wish to have a partial iron shield or flux return in combination with a partial active flux return. For example, the partial active flux return coil may be located at the midplane of the magnet outside the iron shield, with possibly additional other active shield coils outside the iron shield but symmetric relative to the midplane. However, in such a combination magnet the iron shield will necessarily have to be inside of the cryostat, and within the cold volume, adding load to the cryogenic system. Location of the iron shield within the cryostat will also preclude its disassembly, and reduce the portability of the magnet. However, the construction of such a combination magnet according to the present invention, particularly using the structured coils methodology, can allow for an extremely short magnet of high field strength, high field uniformity, and low fringe fields, thus obtaining certain important benefits of the present invention.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A superconducting magnet, comprising:
   a plurality of driving coils surrounding a cylindrical bore, each comprises of superconducting cable, for conducting current in a first direction to generate magnetic flux in said bore having substantially an axial orientation therein, said plurality of coils disposed at varying axial distance surrounding said bore;
   first and second shielding coils, each comprised of superconducting cable, each having a radius greater than that of said driving coil, and disposed at first and second ends of said electromagnet, respectively, said first and second shielding coils conducting current in a second direction opposing said first direction; and
   a flux return, comprising ferromagnetic material and having an innermost radius greater than an outermost radius of said driving coils so as to radially surround at least one of said plurality of driving coils, said flux return axially disposed between said first and second shielding coils, for providing a return path for magnetic flux generated by said driving coil;
   wherein the axial length of said flux return is less than the distance between axially outermost ones of said plurality of driving coils, so that magnetic flux is injected into the axial ends of said flux return by said first and second shielding coils.

2. The magnet of claim 1, wherein first and second ones of said plurality of driving coils are disposed radially inwardly from said first and second shielding coils, respectively.

3. The magnet of claim 2, wherein said first and second ones of said plurality of driving coils each conduct a higher magnitude of current than the remainder of said plurality of driving coils.

4. The magnet of claim 1, wherein at least one of said plurality of driving coils has a cross-section of irregular shape.

5. The magnet of claim 1, wherein said first and second shielding coils each have a cross-section of irregular shape.

6. The magnet of claim 1, further comprising:
   a cryostat, surrounding said plurality of driving coils and said first and second shielding coils, for maintaining a cryogenic temperature therewithin.

7. The magnet of claim 6, wherein said flux return is disposed outside of said cryostat.

8. A superconducting magnet comprising:
   a driving coil surrounding a cylindrical bore, comprised of superconducting cable, for conducting current in a first direction to generate magnetic flux in said bore having substantially an axial orientation therein;

first and second shielding coils, each comprised of superconducting cable, each having a radius greater than that of said driving coil, and disposed at first and second ends of said electromagnet, respectively, said first and second shielding coils conducting current in a second direction opposing said first direction; and a flux return surrounding said driving coil and disposed between said first and second shielding coils, for providing a return path for magnetic flux generated by said driving coil, and injected thereinto by said first and second shielding coils, said flux return comprising a plurality of plates of ferromagnetic material arranged in segments around said driving coil, each of said segments comprising a group of said plurality of plates, disposed adjacent one another, and arranged according to increasing width.

9. The magnet of claim 8, wherein said flux return further comprises:

first and second ferromagnetic rings, disposed at first and second ends of said flux return, respectively, for supporting said plurality of plates thereupon.

10. The magnet of claim 9, wherein said flux return further comprises:

a plurality of inner plates, each disposed between said first and second rings, and each corresponding to one of said segments of said plurality of plates.

11. An apparatus for generating a high magnetic field suitable for nuclear magnetic resonance, comprising:

a superconducting driving solenoid comprising a plurality of driving coils, and having an inner and an outer radius so as to define a cylindrical bore, each of said driving coils conducting current of a first polarity to generate a magnetic field in said bore;

a flux return, comprising ferromagnetic material and having an inner radius greater than the outer radius of said driving solenoid so as to surround at least one of said plurality of driving coils in said driving solenoid, and having an axial length less than the distance between axially outermost ones of said plurality of driving coils; and first and second superconducting shielding coils, disposed at first and second axial ends of said flux return, each of said first and second shielding coils surrounding said bore and conducting current of a second polarity opposing said first polarity to direct the path of return magnetic flux into and out of the first and second ends of said flux return, respectively.

12. The apparatus of claim 11, wherein said flux return comprises a plurality of segments of ferromagnetic material, each of said segments corresponding to a cross-sectional arc of said apparatus.

13. The apparatus of claim 11, wherein first and second ones of said plurality of driving coils are disposed radially inwardly from said first and second shielding coils, respectively.

14. The apparatus of claim 13, wherein said first and second ones of said plurality of driving coils each conduct a higher magnitude of current than the remainder of said plurality of driving coils.

15. The apparatus of claim 11, wherein at least one of said plurality of driving coils has a cross-section of irregular shape.

16. The apparatus of claim 11, further comprising:

a cryostat, surrounding said plurality of driving coils and said first and second shielding coils, for maintaining a cryogenic temperature therewithin;

wherein said flux return is disposed outside of said cryostat.

17. The apparatus of claim 11, wherein said first and second shielding coils each have a cross-section of irregular shape.

18. An apparatus for generating a high magnetic filed suitable for nuclear magnetic resonance, comprising:

a superconducting driving solenoid, surrounding a cylindrical bore, for conducting current of a first polarity to generate a magnetic field in said bore;

a flux return, surrounding said driving solenoid and comprising a plurality of segments of ferromagnetic material, each of said segments corresponding to a cross-sectional arc of said apparatus and comprising a plurality of plates of said ferromagnetic material arranged adjacent one another in increasing width to substantially fill the cross-section arc; and first and second superconducting shielding coils, disposed at first and second axial ends of said flux return and surrounding said bore thereat, conducting current of a second polarity opposing said first polarity, and for injecting return magnetic flux into said flux return.

19. The apparatus of claim 18, wherein said flux return further comprises:

first and second ferromagnetic rings, disposed at first and second ends of said flux return, respectively, for supporting said plurality of plates in each of said segments thereupon; and for each of said segments, an inner plate disposed between said first and second rings.

* * * * *